United States Patent
Anderson et al.

(10) Patent No.: US 8,053,348 B2
(45) Date of Patent: Nov. 8, 2011

(54) METHOD OF FORMING A SEMICONDUCTOR DEVICE USING A SACRIFICIAL UNIFORM VERTICAL THICKNESS SPACER STRUCTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 12/547,537

(22) Filed: Aug. 26, 2009

(65) Prior Publication Data

US 2010/0233873 A1 Sep. 16, 2010

Related U.S. Application Data

(60) Provisional application No. 61/159,164, filed on Mar. 11, 2009.

(51) Int. Cl.
*H01L 21/3205* (2006.01)
(52) U.S. Cl. .................... 438/595; 257/E21.19
(58) Field of Classification Search .............. 438/595; 257/E21.19
See application file for complete search history.

(56) References Cited

U.S. PATENT DOCUMENTS

| 6,887,762 | B1 | 5/2005 | Murthy et al. | |
| 6,924,200 | B2 * | 8/2005 | Furukawa et al. | 438/305 |
| 7,338,873 | B2 | 3/2008 | Murthy et al. | |
| 2006/0076608 | A1 * | 4/2006 | Lee et al. | 257/315 |
| 2007/0020864 | A1 * | 1/2007 | Chong et al. | 438/300 |

FOREIGN PATENT DOCUMENTS

JP 61-117868 6/1986

* cited by examiner

*Primary Examiner* — Alexander Ghyka
*Assistant Examiner* — Stanetta Isaac
(74) *Attorney, Agent, or Firm* — Gibb I.P. Law Firm, LLC; Richard M. Kotulak, Esq.

(57) ABSTRACT

Disclosed is a method of forming planar and non-planar semiconductor devices using a sacrificial gate sidewall spacer with a uniform vertical thickness. The method forms such spacers by selectively growing an epitaxial film on the vertical sidewalls of a gate structure. The use of an epitaxial growth process, as opposed to a deposition and etch process, ensures that the resulting spacers will have a uniform vertical thickness. Then, any process steps (e.g., implant and/or etch process steps) requiring the use of the gate sidewall spacers (e.g., as a mask or shield) are performed. Precise implant and/or etch profiles can be achieved, during these process steps, as a function of the uniformity of the gate sidewall spacers. Once such process steps are completed, the sidewall spacers are selectively removed. Optionally, before removing the sidewall spacers, they can be oxidized in order to enhance the selective removal process.

24 Claims, 11 Drawing Sheets

METHOD OF FORMING A SEMICONDUCTOR DEVICE USING A SACRIFICIAL UNIFORM VERTICAL THICKNESS SPACER STRUCTURE

Applicant claims the benefit of Provisional Application Ser. No. 61/159,164, Method of Forming a Semiconductor Device Using a Sacrificial Uniform Vertical Thickness Spacer Structure, filed on Mar. 11, 2009.

BACKGROUND

1. Field of the Invention

The embodiments of the invention generally relate to semiconductor device processing and, more specifically, to a method of forming planar and non-planar semiconductor devices using a sacrificial uniform vertical thickness spacer structure.

2. Description of the Related Art

Sidewall spacers provide many fundamental functions in semiconductor processing. For example, typically following gate structure formation, a source/drain extension implantation process is performed in order to form source/drain extension regions with relatively low doping levels immediately adjacent to a gate structure. Next, gate sidewall spacers are formed. These gate sidewall spacers subsequently function as masks (i.e., as shields) during a source/drain region implantation process. The source/drain region implant process forms source/drain regions with relatively high doping levels offset from the gate structure by the width of the gate sidewall spacers (i.e., aligned to the gate sidewall spacers). Such sidewall spacers may similarly be used as masks (i.e., as shields) during other process steps, including but not limited to, salicide formation and/or etch steps.

Figure 18:
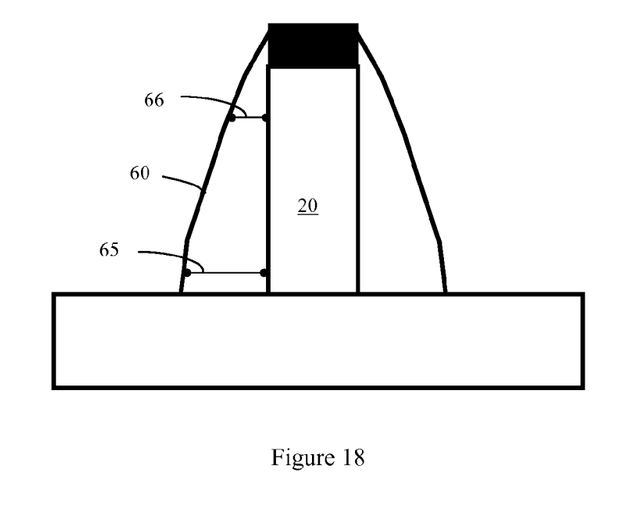
FIG. 18 is a cross-section of a conventional gate sidewall spacer.

Sidewall spacers are conventionally formed by conformally depositing one or more layers of dielectric materials, such as an oxide (e.g., silicon dioxide) and/or a nitride (e.g., silicon nitride), to a desired thickness. However, the conformal deposition results in less material being deposited around the top corners of the gate structure, with rounding occurring. Then, an anisotropic etch process is performed to remove the dielectric material from the horizontal surfaces. As illustrated in FIG. 18, while the etch process is selected to be anisotropic, the resulting sidewall spacers 60 are inevitably tapered (i.e., not uniform) as a result of different deposition rates and etching rates near the upper and lower corners of the gate structure 20. That is, the thickness of the resulting sidewall spacers 60 is greater adjacent to the bottom surface of the gate structure closest to the substrate 10 (see first thickness 65) than it is adjacent to the top surface of the gate structure 20 (see second thickness 66).

As device sizes are scaled, achieving precise implant and/or etch profiles can be critical to achieving reliable electrical performance. For example, precise implant profiles can be critical for avoiding short channel effects, when implanting highly doped source/drain regions offset from the gate structure. Precise etch profiles can similarly be critical for avoiding such short channel effects, when etching trenches to be used for epitaxially grown source/drain regions offset from the gate structure. However, as a result of the tapered gate sidewall spacers, precise implant and/or etch profiles are difficult to achieve. That is, due to the tapered sidewall spacer structure, implant and/or etch profiles are inevitably graded. Such graded profiles can negatively impact device performance. Therefore, there is a need in the art for an improved method of forming planar and non-planar semiconductor devices using a uniform vertical thickness spacer structure in order to achieve precise implant and/or etch profiles and, thereby to optimize device performance.

SUMMARY

Disclosed herein are embodiments of an improved method of forming planar and non-planar semiconductor devices using a sacrificial gate sidewall spacer with a uniform vertical thickness. The method embodiments form such spacers by selectively growing an epitaxial film on the vertical sidewalls of a gate structure. The use of an epitaxial growth process, as opposed to a deposition and etch process, to form the spacers ensures that the resulting spacers will have a uniform vertical thickness. Then, any process steps (e.g., implant and/or etch process steps) requiring the use of the gate sidewall spacers (e.g., as a mask or shield) are performed. Precise implant and/or etch profiles can be achieved, during these process steps, as a function of the uniformity of the gate sidewall spacers. Once such process steps are completed, the sidewall spacers are selectively removed. Optionally, before removing the sidewall spacers, they can be oxidized in order to enhance the selective removal process.

More particularly, disclosed herein are embodiments of a method of forming a non-planar semiconductor device (i.e., a vertical device, such as a fin-type field effect transistor (finFET)). The method embodiments comprise forming a semiconductor body (i.e., a semiconductor fin) for the non-planar semiconductor device on an insulator layer. Next, a gate structure is formed on the insulator layer adjacent to the semiconductor body. Specifically, the gate structure (e.g., a gate dielectric layer-gate conductor layer stack) is formed adjacent to the center portion of the semiconductor body on the opposing sidewalls and across the top surface.

After the gate structure is formed, sacrificial gate sidewall spacers are formed on the vertical sidewalls of the gate structure. These sacrificial gate sidewall spacers are specifically formed by selectively growing an epitaxial film (e.g., a silicon germanium (SiGe), silicon carbide (SiC), or silicon germanium carbide (SiGeC) film) on the vertical sidewalls of the gate structure so that the sidewall spacers have an essentially uniform thickness. That is, the use of an epitaxial growth process, as opposed to a deposition and etch process, to form the spacers ensures that the resulting sidewall spacers will have essentially the same thickness adjacent to the bottom surface of the gate structure closest to the insulator layer as they do adjacent to the top surface of the gate structure.

Once the sidewall spacers are formed, they can be used as masks (i.e., as shields) during at least one subsequent process step. Then, the sidewall spacers are selectively removed. It should be noted that the composition of the epitaxial film should be pre-selected so that it can be selectively etched over the material used in the gate structure. Additionally, prior to removal, the sidewall spacers can be oxidized in order to enhance the selective removal process. After the sidewall spacers are removed, additional processing can be performed in order to complete the semiconductor device structure.

Also disclosed herein are embodiments of a method of forming a planar semiconductor device (i.e., a horizontal device, such as a planar FET). The method embodiments comprise forming isolation structures (e.g., shallow trench isolation (STI) structures) to define an area of a semiconductor layer within which the planar semiconductor device will be formed. Then, a gate structure (e.g., a gate dielectric layer-gate conductor layer stack) for the planar semiconductor device is formed on the semiconductor layer and, particularly, above a designated channel region within the defined area of the semiconductor layer.

After the gate structure is formed, sacrificial gate sidewall spacers with uniform vertical thickness are formed on the vertical sidewalls of the gate structure. To form such sacrificial gate sidewall spacers, an epitaxial film (e.g., a silicon germanium (SiGe), silicon carbide (SiC), or silicon germanium carbide (SiGeC) film) is selectively grown such that it has a vertical portion on the vertical sidewalls of the gate structure and a horizontal portion on the semiconductor layer. After the epitaxial film is selectively grown, an anisotropic etch process is performed to remove the horizontal portion from the semiconductor layer. This anisotropic etch process further leaves the vertical portion on the vertical sidewalls of the gate structure so as to create sacrificial gate sidewall spacers having an essentially uniform thickness. That is, the remaining gate sidewall spacers will have essentially the same thickness adjacent to the bottom surface of the gate structure closest to the semiconductor layer as they do adjacent to the top surface of the gate structure. It should be noted that, while this method embodiment does use an anisotropic etch process, because the sidewall material is formed by selective epitaxy, the sidewall material is uniformly thick on the sidewalls from top to bottom, and thus the tapering of the resultant sidewall spacer is minimized or avoided altogether.

Alternatively, to form such sacrificial gate sidewall spacers, thin nitride spacers can be formed on the sidewalls of the gate structure by conventional means. A thin film of oxide layer can then be thermally grown on the exposed semiconductor layer and the exposed top surface of the gate structure. Next, the thin nitride spacers are selectively removed in order to expose the original gate sidewalls, while keeping the horizontal surfaces of both the semiconductor layer and the gate structure covered by the oxide layer. Then, a uniform thickness epitaxial film is selectively grown to create the sacrificial gate sidewall spacers. The resulting sacrificial sidewall spacers will have a vertical portion on the vertical sidewalls of the gate structure and a horizontal portion on the semiconductor layer.

Once the sidewall spacers are formed, they can be used as masks (i.e., as shields) during at least one subsequent process step. Then, the sidewall spacers are selectively removed. It should be noted that the composition of the epitaxial film should be pre-selected so that it can be selectively etched over the material used in the gate structure. Additionally, prior to removal, the sidewall spacers can be oxidized in order to enhance the selective removal process. After the sidewall spacers are removed, additional processing can be performed in order to complete the semiconductor device structure.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, sidewall spacers provide many fundamental functions in semiconductor processing. Such sidewall spacers are conventionally formed by conformally depositing one or more layers of dielectric materials, such as an oxide (e.g., silicon dioxide) and/or a nitride (e.g., silicon nitride), to a desired thickness. However, the conformal deposition results in less material being deposited around the top corners of the gate structure, with rounding occurring. Then, an anisotropic etch process is performed to remove the dielectric material from the horizontal surfaces. As illustrated in FIG. 18, while the etch process is selected to be anisotropic, the resulting sidewall spacers 60 are inevitably tapered (i.e., not uniform) as a result of the different deposition rates and etching rates near the upper and lower corners of the gate structure 20. That is, the thickness of the resulting sidewall spacers 60 is greater adjacent to the bottom surface of the gate structure closest to the substrate 10 (see first thickness 65) than it is adjacent to the top surface of the gate structure 20 (see second thickness 66).

As device sizes are scaled, achieving precise implant and/or etch profiles can be critical to achieving reliable electric performance. For example, precise implant profiles can be critical for avoiding short channel effects, when implanting highly doped source/drain regions offset from the gate structure. Precise etch profiles can similarly be critical for avoiding such short channel effects, when etching trenches to be used for epitaxially grown source/drain regions offset from the gate structure. However, as a result of the tapered gate sidewall spacers, precise implant and/or etch profiles are difficult to achieve. That is, due to the tapered sidewall spacer structure, implant and/or etch profiles are inevitably graded. Such graded profiles can negatively impact device performance.

In view of the foregoing, disclosed herein are embodiments of an improved method of forming planar and non-planar semiconductor devices using a sacrificial gate sidewall spacer with a uniform vertical thickness. The method embodiments form such spacers by selectively growing an epitaxial film on the vertical sidewalls of a gate structure. The use of an epitaxial growth process, as opposed to a deposition and etch process, to form the spacers ensures that the resulting spacers will have a uniform vertical thickness. Then, any process steps (e.g., implant and/or etch process steps) requiring the use of the gate sidewall spacers (e.g., as a mask or shield) are performed. Precise implant and/or etch profiles can be achieved, during these process steps, as a function of the uniformity of the gate sidewall spacers. Once such process steps are completed, the sidewall spacers are selectively removed. Optionally, before removing the sidewall spacers, they can be oxidized in order to enhance the selective removal process.

Figure 1:
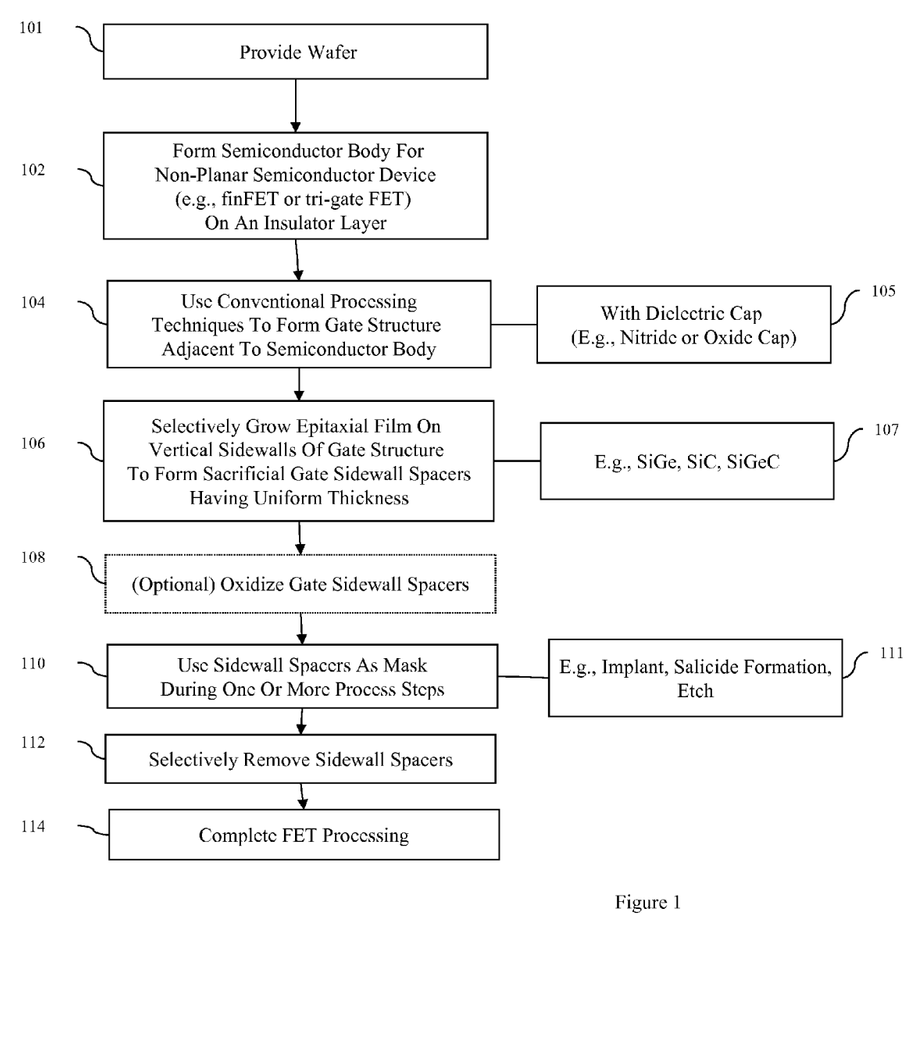
FIG. 1 is a flow diagram illustrating an embodiment of a method of the present invention.
Figure 2:
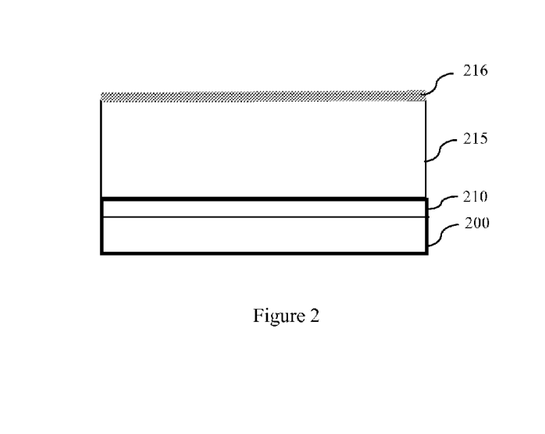
FIG. 2 is a cross-section diagram illustrating a partially completed structure formed according to the method of FIG. 1.

More particularly, referring to the flow diagram of FIG. 1, disclosed herein are embodiments of a method of forming a non-planar semiconductor device (i.e., a vertical device, such as a fin-type field effect transistor (finFET)). The method embodiments comprise providing a wafer (e.g., a silicon-on-insulator (SOI) wafer) (101). This wafer can comprise a substrate 200 (e.g., a single crystalline silicon substrate), an insulator layer 210 (e.g., a buried oxide layer) on the substrate 200, and a semiconductor layer 215 (e.g., a single crystalline silicon layer) on the insulator layer 210 (see FIG. 2). Additionally, the wafer can comprise a thin dielectric cap layer 216 on the semiconductor layer 215 (see FIG. 2). This cap layer 251 can comprise, for example, an oxide (e.g., silicon dioxide) or a nitride (e.g., silicon nitride).

Figure 3A:
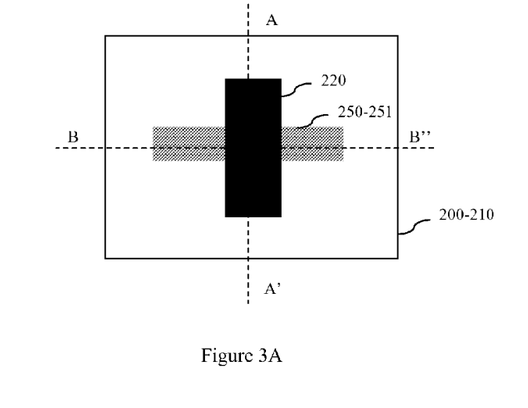
FIG. 3A is a top view diagram illustrating a partially completed structure formed according to the method of FIG. 1.
Figure 3B:
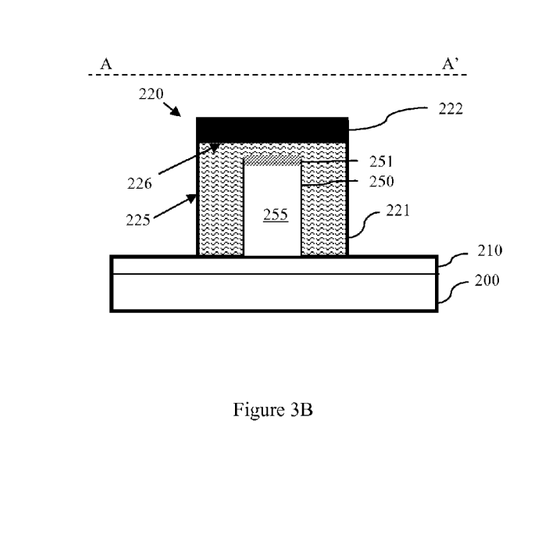
FIG. 3B is a cross-section diagram illustrating a partially completed structure formed according to the method of FIG. 1.
Figure 3C:
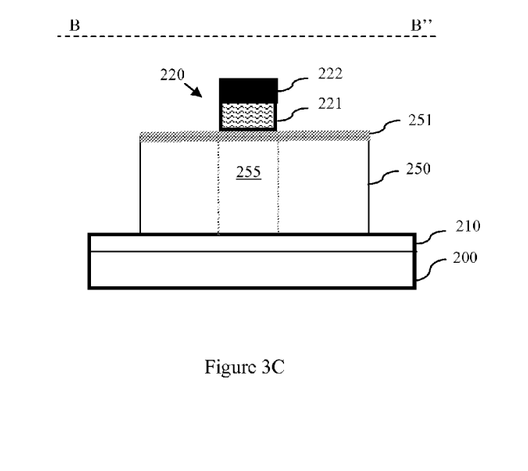
FIG. 3C is a cross-section diagram illustrating a partially completed structure formed according to the method of FIG. 1.

Next, at least one semiconductor body 250 for the non-planar semiconductor device is formed on the insulator layer 210 (102). Specifically, the dielectric cap layer 216 and semiconductor layer 215 can be patterned using conventional techniques (e.g., lithographic patterning or sidewall image transfer patterning techniques) to form one or more semiconductor bodies 250 (i.e., semiconductor fins) on the insulator layer 210, each having a dielectric cap 251 covering its top surface (see the top view diagram of FIG. 3A and the different cross-section view diagrams of FIGS. 3B-3C).

Next, a gate structure 220 is formed on the insulator layer 210 adjacent to a single semiconductor body 250 (as illustrated, in the top view diagram of FIG. 3A) or, in the case of a multi-fin device, adjacent to multiple semiconductor bodies (104). Specifically, the gate structure 220 is formed adjacent to the center portion (i.e., the designated channel region 255) of one or more semiconductor bodies 250 on the opposing sidewalls and across the top surface (see different cross-section views of FIGS. 3B and 3C).

Gate structure formation can be accomplished using conventional processing techniques for non-planar devices. That is, a thin gate dielectric layer (e.g., an oxide layer, a high-k gate dielectric layer or any other suitable gate dielectric layer) can be formed (e.g., deposited) in a conformal layer over the semiconductor body. Next, a blanket polysilicon gate conductor layer 221 can be formed (e.g., deposited) on the gate dielectric layer. A dielectric cap layer 222 comprising, for example, an oxide (e.g., silicon dioxide) or a nitride (e.g., silicon nitride) is formed on the polysilicon gate conductor layer 221. Next, the resulting gate stack (i.e., the cap layer 222, gate conductor layer 221 and gate dielectric layer) is patterned (e.g., lithographically) to form a gate structure 220 that is positioned, as discussed above, adjacent to the center portion (i.e., the designated channel region 255) of one or more semiconductor bodies 250 on the opposing sidewalls and across the top surface.

After the gate structure 220 is formed, processing steps that do not require the use of gate sidewall spacers can be performed. For example, a source/drain extension implantation process can be performed in order to form source/drain extension regions with relatively low doping levels within the semiconductor body (or bodies) immediately adjacent to the gate structure.

Figure 4A:
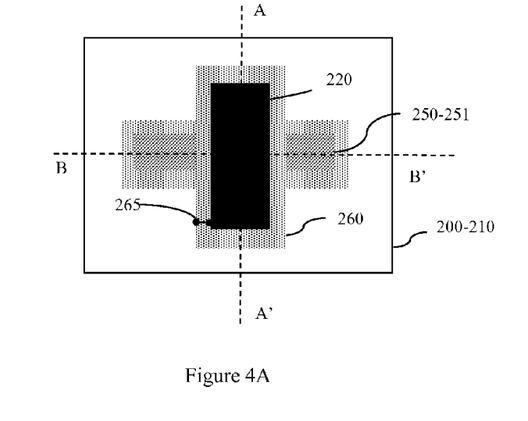
FIG. 4A is a top view diagram illustrating a partially completed structure formed according to the method of FIG. 1.
Figure 4B:
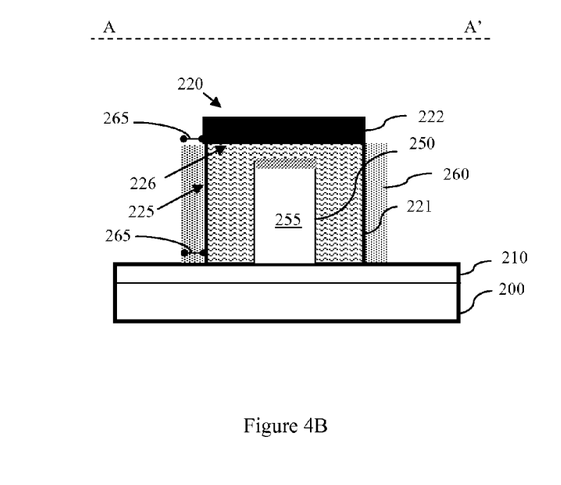
FIG. 4B is a cross-section diagram illustrating a partially completed structure formed according to the method of FIG. 1.
Figure 4C:
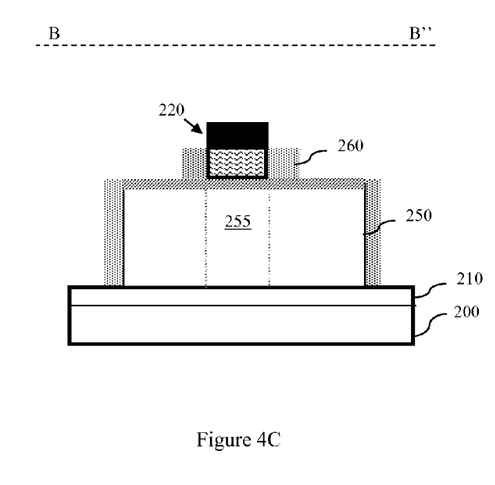
FIG. 4C is a cross-section diagram illustrating a partially completed structure formed according to the method of FIG. 1.

Then, sacrificial gate sidewall spacers 260 are formed on the vertical sidewalls 225 of the gate structure 220 (106, see the top view diagram of FIG. 4A and the different cross-section views of FIGS. 4B-4C). These sacrificial gate sidewall spacers 260 are specifically formed by a selective epitaxial growth (SEG) process. That is, the sacrificial gate sidewall spacers 260 are formed by selectively growing an epitaxial film (e.g., a silicon germanium (SiGe), silicon carbide (SiC), or silicon germanium carbide (SiGeC) epitaxial film) on the vertical sidewalls 225 of the gate structure 220 and, more particularly, on the polysilicon gate conductor 221 so that the sidewall spacers 260 have an essentially uniform thickness (107).

This SEG process can be accomplished using, for example, conventional chemical vapor epitaxy, vapor phase epitaxy, etc. SEG process parameters (e.g., germanium and/or carbon concentrations, temperature, pressure, etc.) should be preselected so as to ensure uniform growth, to minimize Ge and/or C diffusion and to further allow for subsequent selective removal of the gate sidewall spacers 260 (at process 112 discussed in detail below). For example, in one embodiment an epitaxy film of SiGe can be formed with ambient gases comprising $SiH_2Cl_2$, $GeH_4$ with HCl at moderate temperatures in the range of 400° C. to 700° C.

It should be noted that since the gate structure 220 is formed, as described above, with the dielectric cap 222, then the epitaxial film will not grow on the top surface 226 (i.e., the horizontal surface) of the gate structure 220. Similarly, since the semiconductor body 250 is formed on an insulator layer 210, the epitaxial film will also not grow on the horizontal surfaces immediately adjacent to the semiconductor body 250. Thus, in this embodiment, the sidewall spacers 260 can be formed without the use of an anisotropic etch process. The use of a selective epitaxial growth process alone, as opposed to a deposition and etch process, to form the spacers 260 ensures that the resulting sidewall spacers 260 will have essentially the same thickness 265 adjacent to the bottom surface of the gate structure 220 closest to the insulator layer 210 as they do adjacent to the top surface 226 of the gate structure 220.

Figure 5A:
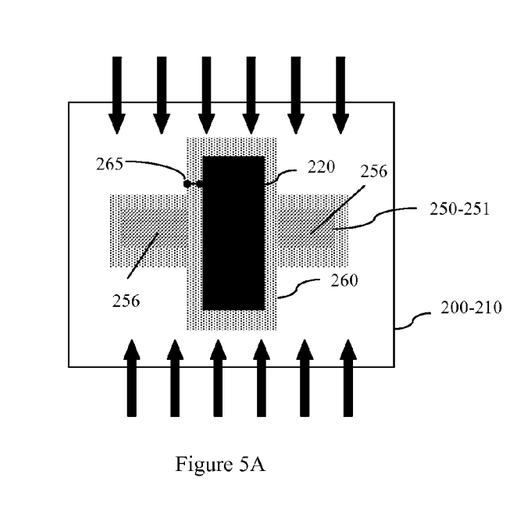
FIG. 5A is a top view diagram illustrating a partially completed structure formed according to the method of FIG. 1.
Figure 5B:
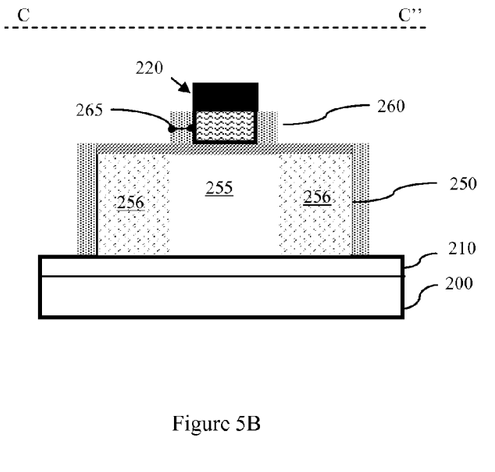
FIG. 5B is a cross-section diagram illustrating a partially completed structure formed according to the method of FIG. 1.
Figure 6:
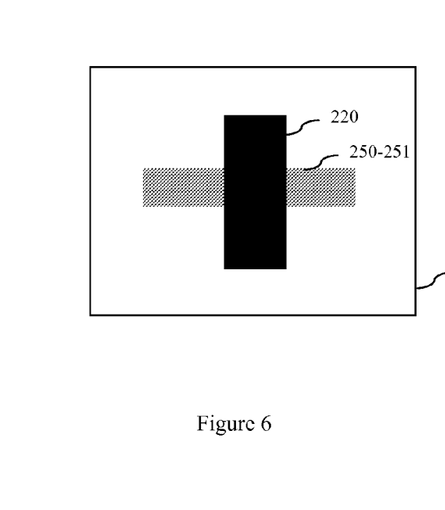
FIG. 6 is a top view diagram illustrating a partially completed structure formed according to the method of FIG. 1.

Once the sidewall spacers 260 are formed, they can be used as masks (i.e., as shields) during at least one subsequent process step (110). Such subsequent process steps can include, but are not limited to, an implant process step, an etch process step, a salicide formation process step, etc. (111). For example, referring to the top view and cross section diagrams of FIGS. 5A and 5B, respectively, the gate sidewall spacers 260 can function as masks (i.e., as shields) during a source/drain region implantation process. The source/drain region implant process forms source/drain regions 256 with relatively high doping levels offset from the gate structure 220 (and, thus, the channel region 255) by the width 265 of the gate sidewall spacers 260.

Then, the sidewall spacers 260 are selectively removed (112). It should be noted that the composition of the epitaxial film (e.g., the concentration of Ge and/or C in the epitaxial film) should be pre-selected so that it can be selectively etched over the polysilicon material used in the gate structure 220. Those skilled in the art will recognize that various techniques (e.g., high temperature etch process, a plasma dry etch process, a wet etch process) are known for selectively etching SiGe, SiC and SiGeC over polysilicon. Optionally, prior to removal (e.g., either before or after process step 110), the sidewall spacers 260 can be oxidized in order to enhance the selective removal process.

After the sidewall spacers 260 are removed, additional processing can be performed in order to complete the semiconductor device structure (114). This additional processing can include, but is not limited to, removal of the dielectric cap 222 from the top surface 226 of the gate structure 220, salicide formation, interlayer dielectric deposition, contact formation, etc.

Figure 7:
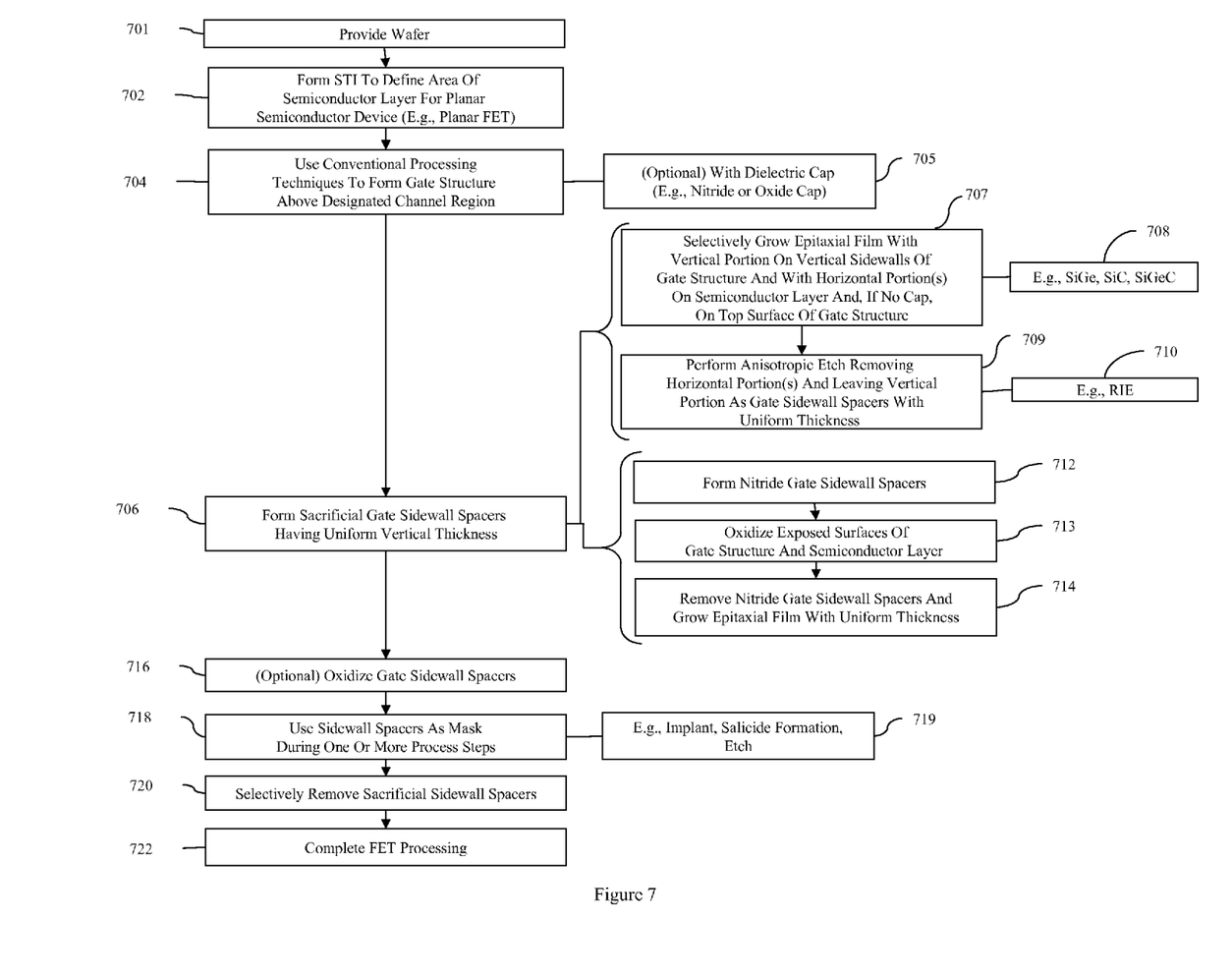
FIG. 7 is a flow diagram illustrating another embodiment of a method of the present invention.
Figure 8:
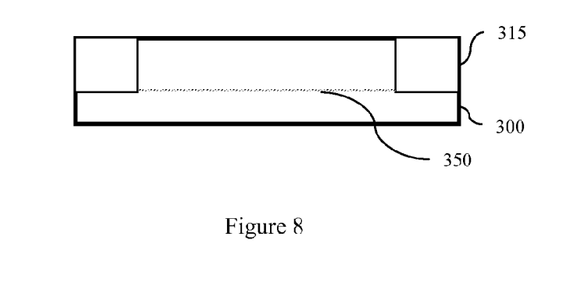
FIG. 8 is a cross-section diagram illustrating a partially completed structure formed according to the method of FIG. 7.

Referring to FIG. 7, also disclosed herein are embodiments of a method of forming a planar semiconductor device (i.e., a horizontal device, such as a planar FET). The method embodiments comprise providing a wafer (e.g., a silicon-on-insulator (SOI) wafer or bulk silicon wafer) (701). Isolation structures 315 (e.g., shallow trench isolation (STI) structures) can be formed (e.g., using conventional STI formation techniques) on the wafer 300 to define an area of a semiconductor layer 350 within which the planar semiconductor device will be formed (702, see FIG. 8).

Figure 9A:
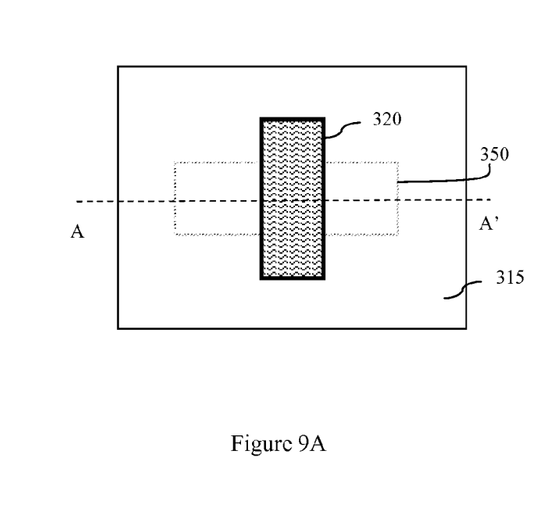
FIG. 9A is a top view diagram illustrating a partially completed structure formed according to the method of FIG. 7.
Figure 9B:
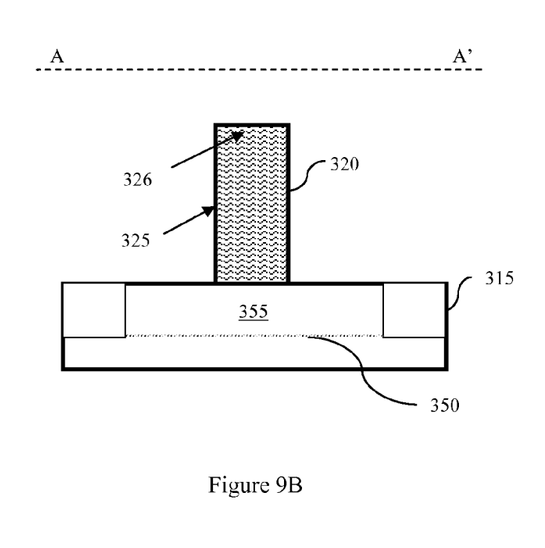
FIG. 9B is a cross-section diagram illustrating a partially completed structure formed according to the method of FIG. 7.

Then, a gate structure 320 for the planar semiconductor device is formed on the semiconductor layer 350 and, particularly, above a designated channel region 355 within the defined area of the semiconductor layer 350 (704, see top view and cross section diagrams of FIGS. 9A and 9B, respectively). Specifically, gate structure 320 formation can be accomplished using conventional processing techniques for planar devices. That is, a thin gate dielectric layer (e.g., an oxide layer, a high-k gate dielectric layer or any other suitable gate dielectric layer) can be formed (e.g., deposited). Next, a blanket polysilicon gate conductor layer can be formed (e.g., deposited) on the gate dielectric layer. Optionally, a dielectric cap layer (not shown) comprising, for example, an oxide (e.g., silicon dioxide) or a nitride (e.g., silicon nitride) can be formed on the polysilicon gate conductor layer. Next, the resulting gate stack (i.e., the optional cap layer, gate conductor layer and gate dielectric layer) is patterned (e.g., lithographically) to form a gate structure 320 that is positioned above a center portion (i.e., the designated channel region 355) of the semiconductor layer 350.

After the gate structure 320 is formed, processing steps that do not require the use of gate sidewall spacers can be performed. For example, a source/drain extension implantation process can be performed in order to form source/drain extension regions with relatively low doping levels within the semiconductor body (or bodies) immediately adjacent to the gate structure.

Figure 10A:
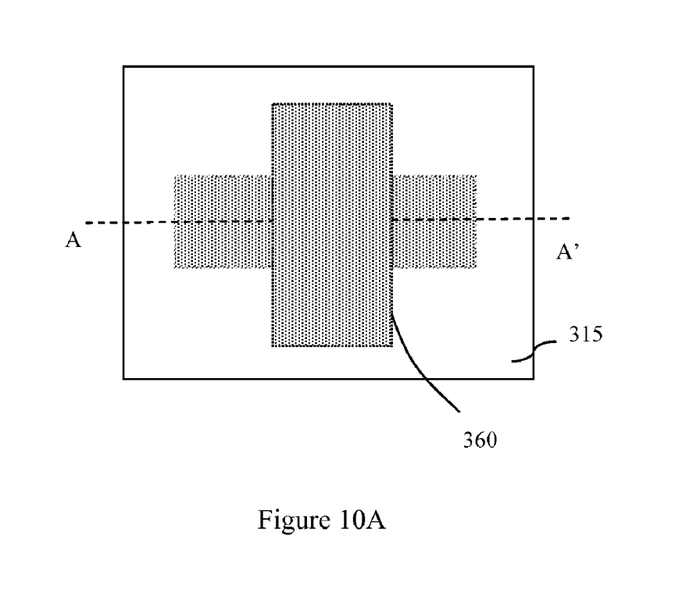
FIG. 10A is a top view diagram illustrating a partially completed structure formed according to the method of FIG. 7.
Figure 10B:
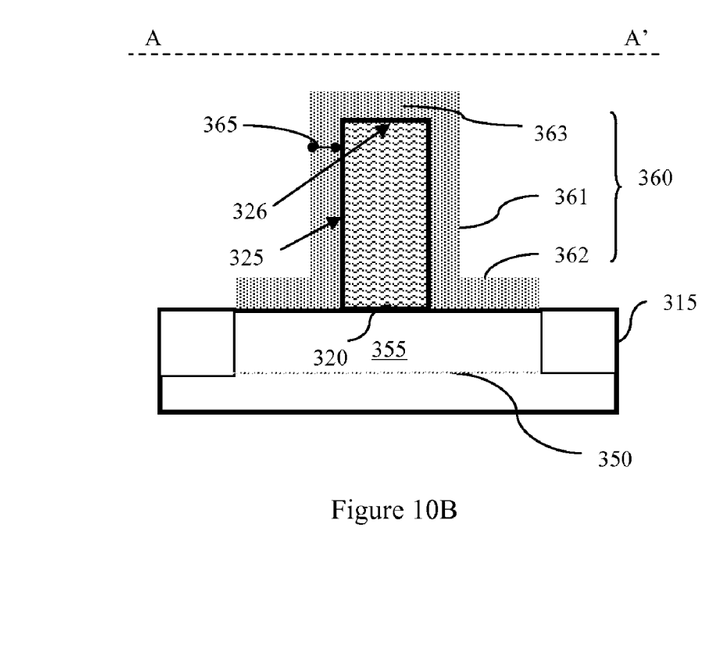
FIG. 10B is a cross-section diagram illustrating a partially completed structure formed according to the method of FIG. 7.

Next, sacrificial gate sidewall spacers, having a uniform vertical thickness, are formed on the vertical sidewalls 325 of the gate structure 320 (706). In one embodiment, an epitaxial film 360 (e.g., a silicon germanium (SiGe), silicon carbide (SiC), or silicon germanium carbide (SiGeC) epitaxial film) is selectively grown such that it has a vertical portion 361 on the vertical sidewalls 325 of the gate structure 320 and a horizontal portion 362 on the semiconductor layer 350 immediately adjacent the gate structure 320 (707-708). It should be noted that if the gate structure is formed at process 704 without the optional dielectric cap, then the process of growing the epitaxial film will result in the growth of an additional horizontal portion 363 on the top surface 326 of the gate structure of the gate structure 320 (see top view and cross section diagrams, respectively, of FIGS. 10A and 10B). However, if the gate structure 320 is formed with the optional dielectric cap, this dielectric cap with ensure that the epitaxial film 360 does not grow on the top surface 326 of the gate structure 320.

The epitaxial film 360 is specifically formed by a selective epitaxial growth (SEG) process. This SEG process can be accomplished using, for example, conventional chemical vapor epitaxy, vapor phase epitaxy, etc. SEG process parameters (e.g., germanium and/or carbon concentrations, temperature, pressure, etc.) should be preselected so as to ensure uniform growth (i.e., that the film 360 has an essentially uniform thickness 365), to minimize Ge and/or C diffusion and to further allow for subsequent selective removal (at process 714 discussed in detail below). For example, in one embodiment an epitaxy film of SiGe can be formed with ambient gases comprising $SiH_2Cl_2$, $GeH_4$ with HCl at moderate temperatures in the range of 400° C. to 700° C.

Figure 11A:
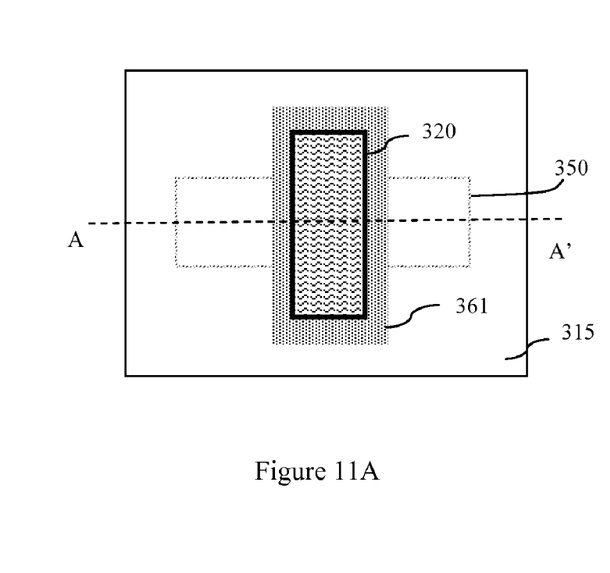
FIG. 11A is a top view diagram illustrating a partially completed structure formed according to the method of FIG. 7.
Figure 11B:
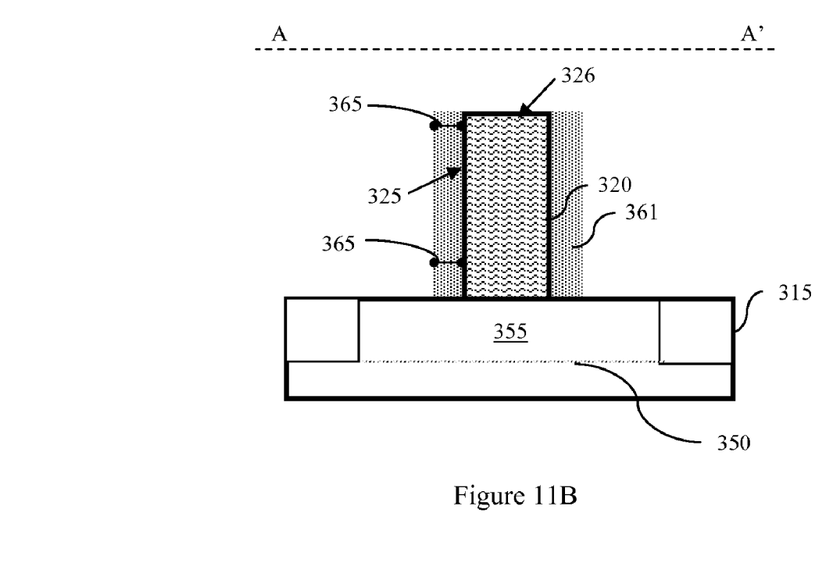
FIG. 11B is a cross-section diagram illustrating a partially completed structure formed according to the method of FIG. 7.

After the epitaxial film 360 is selectively grown, an anisotropic etch process (e.g., a reactive ion etch (RIE) process) is performed to remove the horizontal portion 362 from the semiconductor layer 350 and, if present, the additional horizontal portion 363 from the top surface 326 of the gate structure 320 (709-710, see top view and cross-section diagrams, respectively, of FIGS. 11A and 11B). This anisotropic etch process further leaves the vertical portion 361 on the vertical sidewalls 325 of the gate structure 320 so as to create sacrificial gate sidewall spacers having an essentially uniform thickness. That is, the remaining vertical portion 361 of the epitaxial film 360 will function as gate sidewall spacers and will have essentially the same thickness 365 adjacent to the bottom surface of the gate structure 320 closest to the semiconductor layer 350 as they do adjacent to the top surface 326 of the gate structure 320. It should be noted that, while this method embodiment does use an anisotropic etch process, the tapering of the resultant sidewall spacer 361 is minimized or avoided altogether because the sidewall material is formed by selective epitaxy, the sidewall material is uniformly thick on the sidewalls from top to bottom, and thus the tapering of the resultant sidewall spacer is minimized or avoided altogether.

Figure 12:
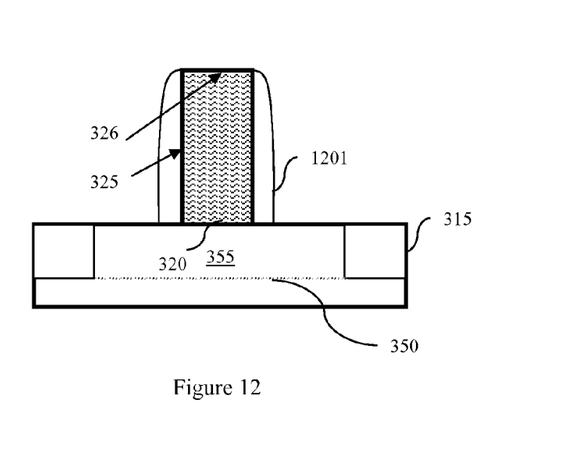
FIG. 12 is a cross-section diagram illustrating a partially competed structure according to the method of FIG. 7.
Figure 13:
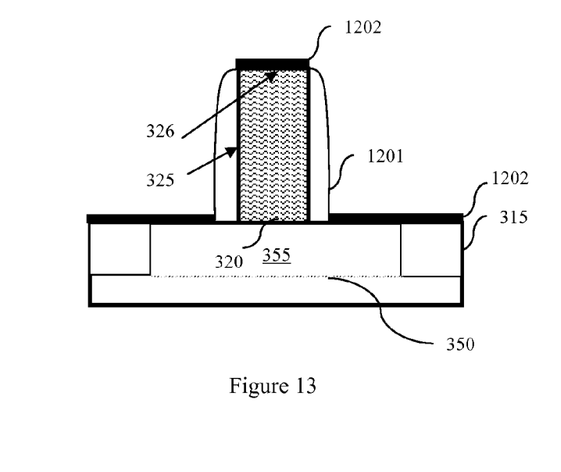
FIG. 13 is a cross-section diagram illustrating a partially competed structure according to the method of FIG. 7.
Figure 14:
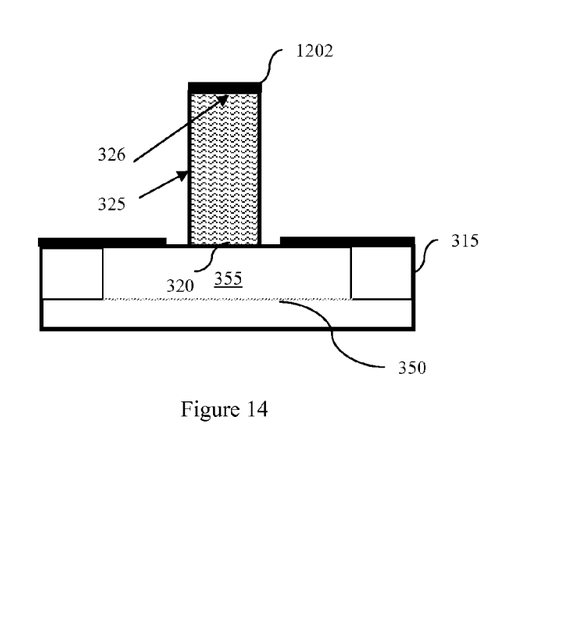
FIG. 14 is a cross-section diagram illustrating a partially competed structure according to the method of FIG. 7.
Figure 15:
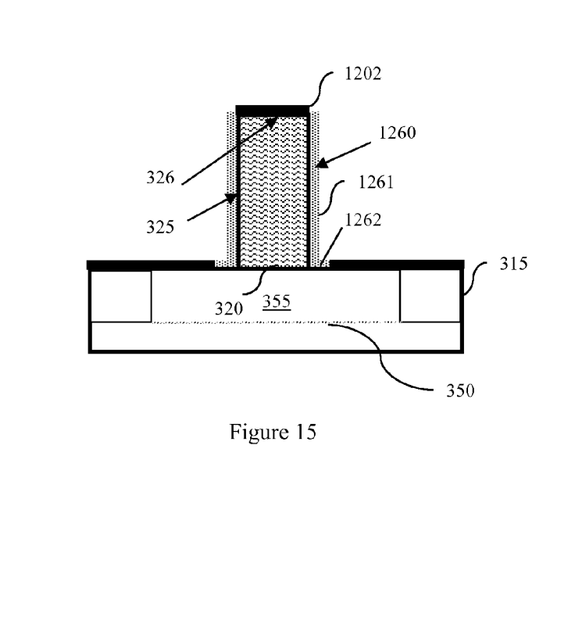
FIG. 15 is a cross-section diagram illustrating a partially competed structure according to the method of FIG. 7.

Alternatively, after the gate structure 320 is formed, thin nitride (e.g., $Si_3N_4$) gate sidewall spacers 1201 can be formed on the sidewalls 325 of the gate structure 320 by conventional means (i.e., by conformal deposition followed by anisotropic etch to completely remove the $Si_3N_4$ from horizontal surfaces) (712, see FIG. 12). A thin oxide film 1202 (e.g., $SiO_2$) can then be thermally grown on the exposed horizontal surface of the semiconductor layer 350 and the exposed top surface 326 of the gate structure 320 (713, see FIG. 13). Next, the $Si_3N_4$ thin spacers 1201 on the sidewalls 325 are selectively removed using an isotropic etch and, thereby exposing the original gate sidewalls 325 but keeping the horizontal surfaces of both the semiconductor layer 350 and the top 326 of the gate structure 320 covered by $SiO_2$ 1202 (714, see FIG. 14). Then, a uniform thickness epitaxial film 1260 (e.g., a silicon germanium (SiGe), silicon carbide (SiC), or silicon germanium carbide (SiGeC) film) is selectively grown, in the same manner as discussed above, to create the sacrificial gate sidewall spacers (714, see FIG. 15). The resulting sacrificial gate sidewall spacers 1260 will have a vertical portion 1261 on the vertical sidewalls 325 of the gate structure 320 and a horizontal portion 1262 on the semiconductor layer 350.

Figure 16:
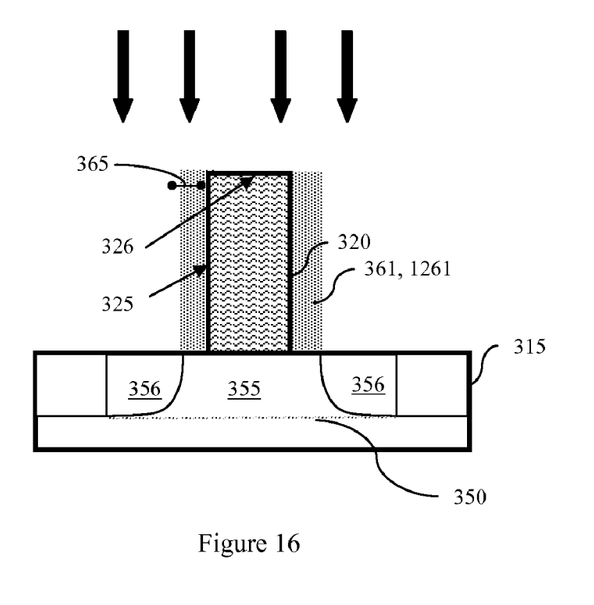
FIG. 16 is a cross-section diagram illustrating a partially competed structure according to the method of FIG. 7.

Once the sidewall spacers (e.g., 361 of FIG. 11B or 1260 of FIG. 15) are formed, they can be used as masks (i.e., as shields) during at least one subsequent process step (718). Such subsequent process steps can include, but are not limited to, an implant process step, an etch process step, a salicide formation process step, etc. (719). For example, the gate sidewall spacers 361 (as shown in FIG. 16, or the gate sidewall spacers 1260 of FIG. 15) can function as masks (i.e., as shields) during a source/drain region implantation process. The source/drain region implant process forms source/drain regions 356 with relatively high doping levels offset from the gate structure 320 (and, thus, the channel region 355) by the width 365 of the gate sidewall spacers 361.

Figure 17:
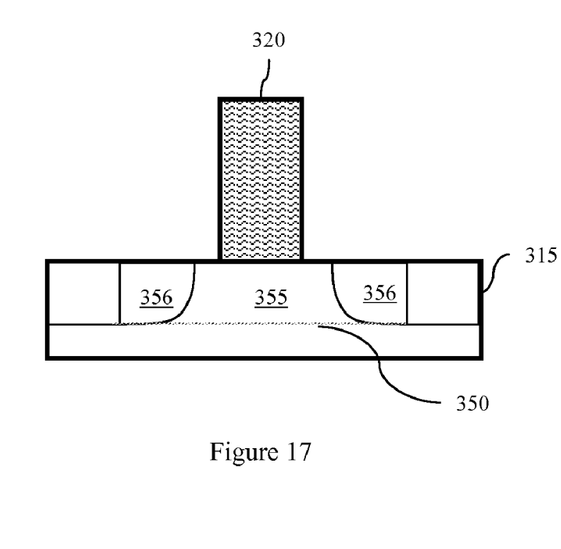
FIG. 17 is a cross-section diagram illustrating a partially completed structure formed according to the method of FIG. 7.

Then, the sacrificial sidewall spacers are selectively removed (720, see FIG. 17). It should be noted that the composition of the epitaxial film (e.g., the concentration of Ge and/or C in the epitaxial film) should be pre-selected so that it can be selectively etched over the polysilicon material used in the gate structure 320. Those skilled in the art will recognize that various techniques (e.g., high temperature etch process, a plasma dry etch process, a wet etch process) are known for selectively etching SiGe, SiC and SiGeC over polysilicon. Optionally, prior to removal (e.g., either before or after process step 718), the sidewall spacers can be oxidized in order to enhance the selective removal process.

After the sidewall spacers are removed, additional processing can be performed in order to complete the semiconductor device structure (722). This additional processing can include, but is not limited to, removal of the optional dielectric cap from the top surface 326 of the gate structure 320, salicide formation, interlayer dielectric deposition, contact formation, etc.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an improved method of forming planar and non-planar semiconductor devices using a sacrificial gate sidewall spacer with a uniform vertical thickness. The method embodiments form such spacers by selectively growing an epitaxial film on the vertical sidewalls of a gate structure. The use of an epitaxial growth process, as opposed to a deposition and etch process, to form the spacers ensures that the resulting spacers will have a uniform vertical thickness. Then, any process steps (e.g., implant and/or etch process steps) requiring the use of the gate sidewall spacers (e.g., as a mask or shield) are performed. Precise implant and/or etch profiles can be achieved, during these process steps, as a function of the uniformity of the gate sidewall spacers. Once such process steps are completed, the sidewall spacers are selectively removed. Optionally, before removing the sidewall spacers, they can be oxidized in order to enhance the selective removal process. Benefits which flow from this invention include, but are not limited to, the ability to fabricate high-speed transistors at lower manufacturing cost, and provide lower power circuits at increased circuit densities. Furthermore, other structures may benefit from less-tapered structures, such as MicroElectroMechanical Structures (MEMS), where less-tapered mechanical structures can provide for more-robust mechanical systems, such as accelerometers, micro-mechanical switches, and so on.

What is claimed is:

1. A method of forming a non-planar semiconductor device, said method comprising
    forming, on an insulator layer, a semiconductor body for said non-planar semiconductor device, said semiconductor body having end portions, a center portion positioned laterally between said end portions, a top surface and opposing sidewalls;
    forming a gate structure adjacent to said center portion of said semiconductor body such that said gate structure comprises:
        vertical sections, having vertical sidewalls, adjacent to said opposing sidewalls of said semiconductor body; and
        a horizontal section adjacent to said top surface of said semiconductor body;
    forming, on said vertical sidewalls of said vertical sections of said gate structure, sidewall spacers such that each sidewall spacer is non-tapered and has an essentially uniform thickness, said forming comprising selectively growing an epitaxial film on said vertical sidewalls;
using said sidewall spacers as masks during at least one subsequent process; and
after said using said sidewall spacers as masks, selectively removing said sidewall spacers.

2. The method of claim 1, said epitaxial film comprising any one of epitaxial silicon germanium, epitaxial silicon carbide, and epitaxial silicon germanium carbide.

3. The method of claim 1, said least one subsequent process comprising at least one of an implant process, a salicide formation process, and an etch process.

4. The method of claim 1, said forming of said gate structure comprising forming said gate structure with a dielectric cap such that, during said selectively growing, said epitaxial film does not grow on said horizontal section of said gate structure, said dielectric cap comprising one of a nitride cap and an oxide cap.

5. The method of claim 1,
further comprising providing a wafer comprising a substrate, said insulator layer on said substrate and a semiconductor layer on said insulator layer;
said forming of said semiconductor body comprising lithographically patterning said semiconductor layer; and
said forming of said gate structure comprising:
forming a gate dielectric layer on said semiconductor body,
forming a polysilicon gate conductor layer on said gate dielectric layer; and
patterning said polysilicon gate conductor layer and said gate dielectric layer to form said gate structure such that said gate structure is positioned adjacent to said opposing sidewalls and said top surface of said center portion of said semiconductor body.

6. A method of forming a non-planar semiconductor device, said method comprising
forming, on an insulator layer, a semiconductor body for said non-planar semiconductor device, said semiconductor body having end portions, a center portion positioned laterally between said end portions, a top surface and opposing sidewalls;
forming a gate structure said gate structure adjacent to said center portion of said semiconductor body such that said gate structure comprises:
vertical sections, having vertical sidewalls, adjacent to said opposing sidewalls of said semiconductor body; and
a horizontal section adjacent to said top surface of said semiconductor body;
forming, on said vertical sidewalls of said vertical sections, sidewall spacers such that each of said sidewall spacers is non-tapered and has an essentially uniform thickness, said forming comprising selectively growing an epitaxial film on said vertical sidewalls;
using said sidewall spacers as masks during at least one subsequent process;
oxidizing said sidewall spacers; and
after said using of said sidewall spacers as masks and after said oxidizing of said sidewall spacers, selectively removing said sidewall spacers, said selective removing being enhanced by said oxidizing of said sidewall spacers.

7. The method of claim 6, said epitaxial film comprising any one of epitaxial silicon germanium, epitaxial silicon carbide, and epitaxial silicon germanium carbide.

8. The method of claim 6, said least one subsequent process comprising at least one of an implant process, a salicide formation process, and an etch process.

9. The method of claim 6, said forming of said gate structure comprising forming said gate structure with a dielectric cap such that, during said selectively growing, said epitaxial film does not grow on said horizontal section of said gate structure, said dielectric cap comprising one of a nitride cap and an oxide cap.

10. The method of claim 6,
further comprising providing a wafer comprising a substrate, said insulator layer on said substrate and a semiconductor layer on said insulator layer;
said forming of said semiconductor body comprising lithographically patterning said semiconductor layer; and
said forming of said gate structure comprising:
forming a gate dielectric layer on said semiconductor body,
forming a polysilicon gate conductor layer on said gate dielectric layer; and
patterning said polysilicon gate conductor layer and said gate dielectric layer to form said gate structure such that said gate structure is positioned adjacent to said opposing sidewalls and said top surface of said center portion of said semiconductor body.

11. The method of claim 6, said oxidizing being performed any one of before and after said using of said sidewall spacers as said masks.

12. A method of forming a planar semiconductor device, said method comprising:
forming, on a semiconductor layer, a gate structure for said planar semiconductor device, said gate structure having vertical sidewalls;
forming sidewall spacers on said vertical sidewalls of said gate structure, said forming of said sidewall spacers comprising:
growing an epitaxial film having a vertical portion on said gate structure and a horizontal portion on said semiconductor layer positioned laterally adjacent to said vertical portion; and
performing an anisotropic etch process that removes said horizontal portion and leaves said vertical portion so as to create, on said vertical sidewalls, sidewall spacers such that each of said sidewall spacers is non-tapered and has an essentially uniform thickness;
using said sidewall spacers as masks during at least one subsequent process; and
after said using of said sidewall spacers as masks, selectively removing said sidewall spacers.

13. The method of claim 12, said epitaxial film comprising any one of epitaxial silicon germanium, epitaxial silicon carbide, and epitaxial silicon germanium carbide.

14. The method of claim 12, said least one subsequent process comprising at least one of an implant process, a salicide formation process, and an etch process.

15. The method of claim 12, said growing further comprising growing an additional horizontal portion of said epitaxial film on a top surface of said gate structure; and said anisotropic etch process further being performed so as to remove said additional horizontal portion.

16. The method of claim 12, said forming of said gate structure comprising forming said gate structure with a dielectric cap such that, during said growing of said epitaxial film, said epitaxial film does not grow on said top surface of said gate structure, said dielectric cap comprising one of a nitride cap and an oxide cap.

17. The method of claim 12, said forming of said gate structure comprising:

forming a gate dielectric layer on said semiconductor layer;

forming a polysilicon gate conductor layer on said gate dielectric layer; and patterning said polysilicon gate conductor layer and said gate dielectric layer to form said gate structure such that said gate structure is positioned above a designated channel region in said semiconductor layer.

18. The method of claim 12, said anisotropic etch process comprising a reactive ion etch process.

19. The method of claim 12, further comprising, before said selectively removing, oxidizing said sidewall spacers.

20. The method of claim 19, further comprising, before said selectively removing, oxidizing said second sidewall spacers.

21. A method of forming a planar semiconductor device, said method comprising forming, on a semiconductor layer, a gate structure for said planar semiconductor device, said gate structure having a top surface and vertical sidewalls;

forming first sidewall spacers on said vertical sidewalls of said gate structure, said first sidewall spacers comprising a nitride and being tapered;

forming an oxide layer on exposed portions of said semiconductor layer adjacent to said first sidewall spacers and further on said top surface of said gate structure;

after said forming of said oxide layer, selectively removing said first sidewall spacers so as to expose said vertical sidewalls and portions of said semiconductor layer between said oxide layer and said vertical sidewalls;

growing an epitaxial film to create second sidewall spacers, said second sidewall spacers each comprising: a vertical portion on a vertical sidewall of said gate structure such that said vertical portion is non-tapered and has an approximately uniform thickness; and, a horizontal portion on an exposed portion said semiconductor layer between said oxide layer and said vertical portion;

using said second sidewall spacers as masks during at least one subsequent process; and, after said using of said second sidewall spacers as masks, selectively removing said second sidewall spacers.

22. The method of claim 21, said epitaxial film comprising any one of epitaxial silicon germanium, epitaxial silicon carbide, and epitaxial silicon germanium carbide.

23. The method of claim 21, said least one subsequent process comprising at least one of an implant process, a salicide formation process, and an etch process.

24. The method of claim 21, said forming of said gate structure comprising:

forming a gate dielectric layer on said semiconductor layer, forming a polysilicon gate conductor layer on said gate dielectric layer; and patterning said polysilicon gate conductor layer and said gate dielectric layer to form said gate structure such that said gate structure is positioned above a designated channel region in said semiconductor layer.

* * * * *